(12) United States Patent
Sanborn et al.

(10) Patent No.: US 8,754,679 B2
(45) Date of Patent: Jun. 17, 2014

(54) LOW CURRENT POWER-ON RESET CIRCUIT AND METHOD

(75) Inventors: Keith E. Sanborn, Tucson, AZ (US); Johnnie F. Molina, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 954 days.

(21) Appl. No.: 12/586,880

(22) Filed: Sep. 29, 2009

(65) Prior Publication Data
US 2011/0074470 A1 Mar. 31, 2011

(51) Int. Cl.
*H03L 7/00* (2006.01)
*H03K 17/22* (2006.01)

(52) U.S. Cl.
CPC .................................... *H03K 17/223* (2013.01)
USPC ........................................................ 327/143

(58) Field of Classification Search
USPC .................. 327/77, 78, 80, 81, 142, 143, 198
See application file for complete search history.

(56) References Cited

U.S. PATENT DOCUMENTS

| | | | |
|---|---|---|---|
| 5,760,624 A | 6/1998 | McClintock | 327/143 |
| 6,181,173 B1* | 1/2001 | Homol et al. | 327/143 |
| 6,288,584 B1 | 9/2001 | Wu et al. | 327/143 |
| 6,515,523 B1 | 2/2003 | Bikulcius | 327/142 |
| 6,914,476 B2* | 7/2005 | Ingino, Jr. | 327/540 |
| 7,184,739 B2* | 2/2007 | Igarashi et al. | 455/313 |
| 2007/0285861 A1* | 12/2007 | Kim | 361/91.3 |
| 2008/0309384 A1* | 12/2008 | Guimont et al. | 327/143 |

* cited by examiner

*Primary Examiner* — Sibin Chen
(74) *Attorney, Agent, or Firm* — John J. Patti; W. James Brady, III; Frederick J. Telecky, Jr.

(57) ABSTRACT

A power-on reset (POR) circuit includes a first transistor ($MP_a$) having a source coupled to a first supply voltage ($V_{DD}$) and a gate coupled to a second supply voltage (GND). A resistor ($R_0$) has a first terminal coupled by a depletion mode transistor (JP0) to the second supply voltage and a second terminal coupled to a drain of the first transistor. A Schmitt trigger (20) has an input coupled to receive a first signal ($V_{TRIGGER}$) on a conductor (14) coupled to the second terminal of the resistor and a terminal of a capacitor ($C_0$), for producing an output voltage ($V_O$) representative of a power-on reset signal ($V_{POR}$) in response to an interruption of the first supply voltage ($V_{DD}$).

19 Claims, 5 Drawing Sheets

LOW CURRENT POWER-ON RESET CIRCUIT AND METHOD

BACKGROUND OF THE INVENTION

The present invention relates generally to "power-on reset" (POR) circuits, particularly to a power-on reset circuit which dissipates very little power, occupies a very small amount of integrated circuit chip area, and rapidly discharges a storage capacitor that establishes a delay between an interruption in power supply voltage and an edge of a power-on reset signal generated by the power-on reset circuit.

A POR circuit resets circuitry, especially digital logic circuitry, when the power supply voltage falls below a minimum acceptable operating voltage. Preferably, a POR circuit should occupy as little integrated circuit chip area as possible. It should also consume as little power and draw as little current (e.g., less than 500 nanoamperes) from the power supply. Preferably, a POR circuit should not generate a POR output signal in response to minor fluctuations of the power supply voltage.

Power-on reset (POR) circuit 1 in Prior Art FIG. 1A has been widely used by the present assignee and others. POR reset circuit 1 includes a P-channel transistor MP0 having its source connected to $V_{DD}$, its gate connected to ground, and its drain connected to one terminal of a resistor $R_1$. The other terminal of resistor $R_1$ is connected by conductor 2 to one terminal of a resistor $R_0$, one terminal of a discharge capacitor $C_0$, and the input of a first inverter 3. The other terminal of discharge capacitor $C_0$ is connected to ground. The other terminal of resistor $R_0$ is connected to the drain of an N-channel transistor MN0, the source of which is connected to ground. The output of inverter 3 is connected to the input of a second inverter 4, the output of which is connected by conductor 6 to the input of a third inverter 5. Inverter 4 generates a power-on reset voltage $V_{POR}$ on conductor 6. The output of inverter 5 is connected by conductor 7 to the gate of transistor MN0. This eliminates current from flowing through the branch formed by MP0, $R_1$, $R_0$, and MN0 in FIG. 1A. The upper and lower bias terminals of inverters 3, 4 and 5 are connected to $V_{DD}$ and ground, respectively.

FIG. 1B shows an equivalent circuit representation of the left branch of POR circuit 1 of FIG. 1A for the case in which the power supply voltage $V_{DD}$ is interrupted and falls to ground. In this case, the $V_{DD}$ terminal of the power supply would appear as a short circuit to ground. P-channel transistor MP0 is represented by its "channel off" resistance $R_{ds}$ connected in parallel with its drain-bulk diode. N-channel transistor MN0 is also represented by its "channel off" resistance $R_{ds}$ connected in parallel with its drain-bulk diode.

Discharge capacitor $C_0$ along with resistor $R_1$, on-resistance of MP0 in parallel with resistor $R_0$, and on-resistance of MN0 in Prior Art FIGS. 1A and 1B create a time constant which introduces a delay between the time at which supply voltage $V_{DD}$ ramps up and the time at which $V_{POR}$ makes a transition from a logic low "0" level to a logic high "1" level. Once that transition occurs, transistor MN0 is turned off. If there is an interruption in the supply voltage $V_{DD}$, transistors MP0 and MN0 will be turned off. The charge on discharge capacitor $C_0$ cannot be removed in a short period of time since the effective impedances of transistors MP0 and MN0 are extremely large. This prevents the prior art POR circuit 1 from producing an adequate response by the output voltage $V_{POR}$ to an interruption of $V_{DD}$.

Although prior art POR circuit 1 of FIGS. 1A and 1B always works in response to an initial application of a normal value of supply voltage $V_{DD}$, it requires as much as 10 or more seconds to remove the charge from discharge capacitor $C_0$ when a sudden interruption of $V_{DD}$ occurs. This is because transistor MP0 is turned off and discharge transistor MN0 remains turned off by inverter 5. Hence, most of the discharging of capacitor $C_0$ occurs through the drain-bulk diodes of transistors MP0 and MN0. As discharging of capacitor $C_0$ progresses, the effective impedances of the drain-bulk diodes of transistors MP0 and MN0 through which the discharging occurs continue to increase. This results in the previously mentioned long delay before power-on reset signal $V_{POR}$ transitions from a logic high "1" level to a logic low "0" level in response to the interruption of $V_{DD}$.

The waveforms for POR circuit 1 of Prior Art FIG. 1A are somewhat similar to those shown in subsequently described FIGS. 4A-C in response to a ramp-up and/or ramp-down of $V_{DD}$. However, the response of POR circuit 1 to a ramp-down of $V_{DD}$ is very slow, due to the previously described extremely slow discharge of capacitor $C_0$.

Thus, there is an unmet need for a power-on reset circuit that rapidly discharges a storage capacitor that determines a delay between an interruption or loss of power supply voltage and an edge of a power-on reset signal generated by the power-on reset circuit.

There also is an unmet need for a power-on reset circuit that rapidly discharges a storage capacitor that determines a delay between an interruption or loss of power supply voltage and an edge of a power-on reset signal generated by the power-on reset circuit and dissipates very little power.

There also is an unmet need for a power-on reset circuit that rapidly discharges a storage capacitor that determines a delay between an interruption or loss of power supply voltage and an edge of a power-on reset signal generated by the power-on reset circuit, occupies a very small amount of integrated circuit chip area, and dissipates very little power.

There also is an unmet need for a power-on reset circuit that rapidly discharges a storage capacitor that determines a delay between an interruption or loss of power supply voltage and an edge of a power-on reset signal generated by the power-on reset circuit, occupies a very small amount of integrated circuit chip area, dissipates very little power, and does not generate a power-on reset output signal in response to minor fluctuations in the power supply voltage.

SUMMARY OF THE INVENTION

It is an object of the invention to provide a power-on reset circuit that rapidly discharges a storage capacitor that determines a delay between an interruption or loss of power supply voltage and an edge of a power-on reset signal generated by the power-on reset circuit.

It is another object of the invention to provide a power-on reset circuit that rapidly discharges a storage capacitor that determines a delay between an interruption or loss of power supply voltage and an edge of a power-on reset signal generated by the power-on reset circuit and dissipates very little power.

It is another object of the invention to provide a power-on reset circuit that rapidly discharges a storage capacitor that determines a delay between an interruption or loss of power supply voltage and an edge of a power-on reset signal generated by the power-on reset circuit, occupies a very small amount of integrated circuit chip area, and dissipates very little power.

It is another object of the invention to provide a power-on reset circuit that rapidly discharges a storage capacitor that determines a delay between an interruption or loss of power supply voltage and an edge of a power-on reset signal generated by the power-on reset circuit, occupies a very small amount of integrated circuit chip area, dissipates very little power, and does not generate a power-on reset output signal in response to minor fluctuations in the power supply voltage.

Briefly described, and in accordance with one embodiment, the present invention provides a power-on reset (POR) circuit that includes a first transistor ($MP_a$) having a source coupled to a first supply voltage ($V_{DD}$) and a gate coupled to a second supply voltage (GND). A resistor ($R_0$) has a first terminal coupled to the second supply voltage and a second terminal coupled to a drain of the first transistor. A trigger circuit (20), which can be a Schmitt trigger, has an input coupled to receive a first signal ($V_{TRIGGER}$) coupled to the second terminal of the resistor and a terminal of a capacitor ($C_0$), for producing an output voltage ($V_O$) representative of a power-on reset signal ($V_{POR}$) in response to an interruption of the first supply voltage ($V_{DD}$). The first terminal of the resistor ($R_0$) can be coupled to the second supply voltage (GND) by means of a depletion mode transistor (JP0) having a gate coupled to the drain of the first transistor.

In one embodiment, the invention includes a power-on reset (POR) circuit (10) including a first transistor ($MP_a$) having a source coupled to a first supply voltage ($V_{DD}$) and a gate coupled to a second supply voltage (GND), a first resistor ($R_0$) having a first terminal coupled to the second supply voltage (GND) and a second terminal coupled to a drain of the first transistor ($MP_a$). The POR circuit includes a trigger circuit (20) having an input coupled to receive a first signal ($V_{TRIGGER}$) on a first conductor (14) coupled to the second terminal of the first resistor ($R_0$) and a terminal of a discharge capacitor ($C_0$), for producing an output voltage ($V_O$) representative of a power-on reset signal ($V_{POR}$) in response to an interruption of the first supply voltage ($V_{DD}$).

In a described embodiment, the first terminal of the first resistor ($R_0$) is coupled to the second supply voltage (GND) by means of a second transistor (JP0) having a drain coupled to the second supply voltage (GND) and a source coupled to the first terminal of the first resistor ($R_0$). The drain of the first transistor ($MP_a$) and a gate of the second transistor (JP0) are coupled to the second terminal of the first resistor ($R_0$) and the terminal of the discharge capacitor ($C_0$). The second transistor (JP0) is a depletion mode transistor, and a channel of the second transistor (JP0) is pinched off when the gate of the second transistor (JP0) is at a voltage close to the first supply voltage ($V_{DD}$). In the described embodiments, the first transistor ($MP_a$) is a P-channel transistor and the second transistor (JP0) is a P-channel transistor. The first transistor ($MP_a$) can be a MOS (metal oxide semiconductor) field-effect transistor and the second transistor (JP0) can be a junction field-effect transistor.

In a described embodiment, the trigger circuit (20) is an inverting Schmitt trigger circuit, and the power-on reset circuit (10) includes an inverter (23) having an input coupled to an output of the Schmitt trigger circuit (20) and an output (24) on which the power-on reset signal ($V_{POR}$) is produced. The first resistor ($R_0$) may have a resistance greater than approximately 1 megohm. The described Schmitt trigger circuit (20) has a first switching voltage at which the Schmitt trigger circuit (20) switches from a first state to a second state when the first signal ($V_{TRIGGER}$) increases from a voltage less than the first switching voltage to a voltage greater than the first switching voltage. The Schmitt trigger circuit (20) also has a second switching voltage at which the Schmitt trigger circuit (20) switches from the second state to the first state when the first signal ($V_{TRIGGER}$) decreases from a voltage greater than the second switching voltage to a voltage less than the second switching voltage. In a described embodiment, the first resistor ($R_0$) is composed of polycrystalline silicon. In a described embodiment, the drain of the first transistor ($MP_a$) is coupled to the first conductor (14) by means of a third transistor ($MP_b$) having a gate connected to the gate of the first transistor ($MP_a$).

In a described embodiment, the invention provides a method for producing a power-on reset signal ($V_{POR}$) in response to an interruption of a first supply voltage ($V_{DD}$), including coupling the first supply voltage ($V_{DD}$), by means of a first transistor ($MP_a$), to a first conductor (14) that is coupled to a first terminal of a discharge resistor ($R_0$), a terminal of a discharge capacitor ($C_0$), and an input of a trigger circuit (20) and coupling a gate of the first transistor ($MP_a$) to a second supply voltage (GND), a first signal ($V_{TRIGGER}$) being produced on the first conductor (14), charging the discharge capacitor ($C_0$) through the first transistor ($MP_a$) to produce the first signal ($V_{TRIGGER}$) by increasing the first supply voltage ($V_{DD}$) after the interruption so as to cause the trigger circuit (20) to produce an output signal ($V_O$) representative of the power-on reset signal ($V_{POR}$), and discharging the discharge capacitor ($C_0$) through the discharge resistor ($R_0$), a resistance of the discharge resistor ($R_0$) being sufficiently high to provide a predetermined low average power dissipation of the power-on reset circuit (10).

In a described embodiment, the method includes coupling the gate of the first transistor ($MP_a$) to the second supply voltage (GND), coupling a second transistor (JP0) between the second supply voltage (GND) and a second terminal of the discharge resistor ($R_0$), the second transistor (JP0) being a depletion mode transistor, and turning on the second transistor (JP0) in response to a substantial decrease of the first supply voltage ($V_{DD}$). A gate of the second transistor (JP0) is coupled to a drain of the first transistor ($MP_a$), and the method includes discharging the discharge capacitor ($C_0$) through both the discharge resistor ($R_0$) and the second transistor (JP0), wherein the resistance of the discharge resistor ($R_0$) and effective impedance of the second transistor (JP0) are sufficiently high to provide a predetermined low average power dissipation of the power-on reset circuit (10).

In a described embodiment, the method includes causing the Schmitt trigger circuit (20) to have a first switching voltage at which the Schmitt trigger circuit (20) switches from a first state to a second state when the first signal ($V_{TRIGGER}$) increases from a voltage less than the first switching voltage to a voltage greater than the first switching voltage. The method also includes causing the Schmitt trigger circuit (20) to have a second switching voltage at which the Schmitt trigger circuit (20) switches from the second state to the first state when the first signal ($V_{TRIGGER}$) decreases from a voltage greater than the second switching voltage to a voltage less than the second switching voltage.

In one embodiment, the invention provides a power-on reset circuit (10) for producing a power-on reset signal ($V_{POR}$) in response to an interruption of a first supply voltage ($V_{DD}$), including first transistor means ($MP_a$) for coupling the first supply voltage ($V_{DD}$) to produce a first voltage ($V_{TRIGGER}$), coupling a gate of the first transistor means ($MP_a$) to a second supply voltage (GND), means (14) for applying the first voltage ($V_{TRIGGER}$) to a terminal of a discharge capacitor ($C_0$) to charge the discharge capacitor ($C_0$) to the first supply voltage ($V_{DD}$), means (14) for applying the first voltage ($V_{TRIGGER}$) to a first terminal of a discharge resistor ($R_0$) and an input of a trigger circuit (20), and means (JP0) for discharging the discharge capacitor ($C_0$) through the discharge resistor ($R_0$) in response to the interruption of the first supply voltage ($V_{DD}$), an effective impedance including a resistance of the discharge resistor ($R_0$) being sufficiently high to provide a predetermined low average power dissipation of the power-on reset circuit (10).

DETAILED DESCRIPTION OF THE PREFERRED EMBODIMENTS

Figure 2:
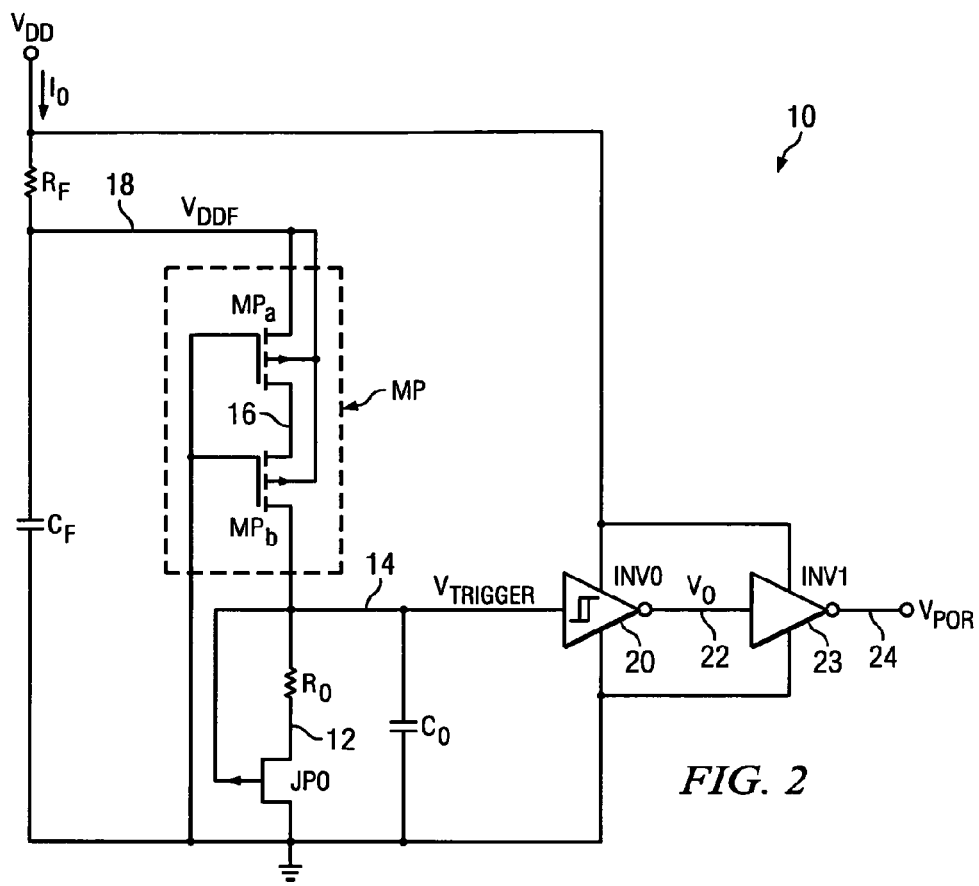
FIG. 2 is a schematic diagram of a POR circuit of the present invention.

Referring to FIG. 2, POR circuit 10 includes a filter resistor $R_F$ connected between $V_{DD}$ and conductor 18. A filter capacitor $C_F$ is connected between conductor 18 and ground (or $V_{SS}$). The filter composed of resistor $R_F$ and capacitor $C_F$ produces a filtered supply voltage $V_{DDF}$ on conductor 18 to prevent false triggering of POR circuit 10. P-channel transistor or transistor circuit MP is connected between conductors 14 and 18. The gate of transistor MP is connected to ground. Transistor or transistor circuit MP can be implemented as a single transistor with its gate connected to ground or by means of two series-connected P-channel transistors $MP_a$ and $MP_b$ with their gates connected to ground in order to make the layout of POR circuit 10 more compact, as shown. Conductor 14 in FIG. 2 is connected to one terminal of a discharge resistor $R_0$, one terminal of a discharge capacitor $C_0$, the gate of a P-channel JFET (Junction Field-Effect Transistor) JP0, and the input of an inverting Schmitt trigger 20. The second terminal of discharge capacitor $C_0$ can be connected to ground or other suitable reference. The second terminal of discharge resistor $R_0$ is connected to the source of transistor JP0. The drain of transistor JP0 is connected to ground.

A voltage $V_{TRIGGER}$ is generated on conductor 14 and applied to the input of Schmitt trigger 20. The output voltage $V_O$ produced by Schmitt trigger 20 is coupled by conductor 22 to the input of an inverter 23. The upper and lower bias terminals of Schmitt trigger 20 and inverter 23 are connected to $V_{DD}$ and ground, respectively. $I_0$ is the total current flowing from $V_{DD}$ into POR circuit 10.

In one embodiment of the invention, the total current $I_0$ rapidly increases once $V_{TRIGGER}$ rises to the input switching voltage of Schmitt trigger 20, due to Schmitt trigger 20 and inverter 23 changing logic states. After Schmitt trigger 20 and inverter 23 switch states, the total current $I_0$ rapidly decreases to a very low value (e.g., approximately 65 nanoamperes in one embodiment of the invention). The lowest value of total current $I_0$ is set by the current flowing through transistor MP, discharge resistor $R_0$, and pinched-off transistor JP0 when $V_{DD}$ is at its normal operating value.

As $V_{TRIGGER}$ rises to the input switching voltage of Schmitt trigger 20, it causes the voltage $V_O$ on conductor 22 to go from a logic high "1" level to a logic low "0" level. This change in the voltage $V_O$ causes inverter 23 to produce a logic high "1" level of power-on reset signal $V_{POR}$.

For a slow ramp-up of $V_{DD}$, the filtered supply voltage $V_{DDF}$ on conductor 18 is essentially identical to $V_{DD}$. Once $V_{DD}$ (and $V_{DDF}$) ramps up to a level greater than the threshold voltage of transistor MP, part of total current $I_0$ begins flowing into conductor 14 through turned-on transistor MP. This causes the voltage $V_{TRIGGER}$ to increase in value. $V_{TRIGGER}$ is initially less than the pinch-off voltage of transistor JP0, so the channel resistance of transistor JP0 is low (e.g., 5 kilohms). However, a typical value for discharge resistor $R_0$ (which may be fabricated using polycrystalline silicon or sichrome) might be greater than a megohm. Consequently, transistor JP0 has a relatively small effect on the ramp-up of $V_{TRIGGER}$.

Figure 3:
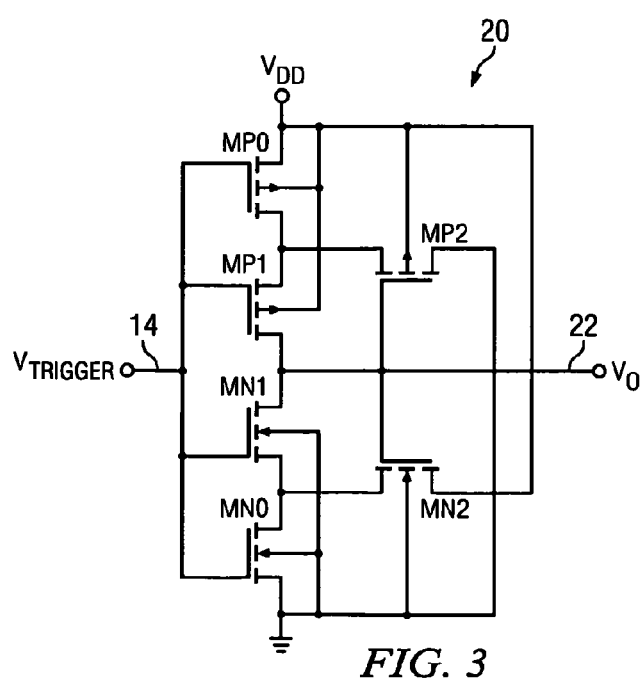
FIG. 3 is a schematic diagram of the Schmitt trigger 20 of FIG. 2.

The details of Schmitt trigger 20 are shown in FIG. 3. P-channel transistors MP0 and MP1 are connected in series between $V_{DD}$ and conductor 22. N-channel transistors MN1 and MN0 are connected in series between conductor 22 and ground. The gates of transistors MP0, MP1, MN1, and MN0 are coupled to $V_{TRIGGER}$. The drains of transistors MP1 and MN1 are connected to conductor 22 where the Schmitt trigger output voltage $V_O$ is generated. The source of transistor MP1 is connected to the drain of transistor MP0 and the source of P-channel transistor MP2. The source of transistor MP0 is connected to $V_{DD}$, and the drain of transistor MP2 is connected to ground. The source of N-channel transistor MN1 is connected to the drain of transistor MN0 and the source of transistor MN2. The source of transistor MN0 is connected to ground, and the drain of transistor MN2 is connected to $V_{DD}$.

Transistors MP0, MP2, MN0, and MN2 of Schmitt trigger 20 cause it to have two distinct switching voltages: an "upper" switching voltage and a "lower" switching voltage. The Schmitt trigger output voltage $V_O$ changes from a logic "1" level to a logic "0" level when the input voltage $V_{TRIGGER}$ increases beyond the "upper" switching voltage. The Schmitt trigger output voltage $V_O$ goes from a logic "0" level to a logic "1" level when the input voltage $V_{TRIGGER}$ decreases below the "lower" switching voltage. This is in contrast to a typical inverter, such as inverter 23 in FIG. 2, which has a switching voltage fixed at a particular voltage level. If the input voltage increases beyond this voltage level, the inverter's output goes from a logic "1" level to a logic "0" level. If the input voltage falls below that voltage level, the inverter's output changes from a logic "0" level to a logic "1" level.

If the Schmitt trigger input voltage $V_{TRIGGER}$ is initially at 0 volts, then the Schmitt trigger output voltage $V_O$ is at a logic"1" level (i.e., $V_{DD}$). Transistors MN0 and MN1 are turned off. Transistor MN2 is turned on and holds the source of transistor MN1 at $V_{DD}$ minus the threshold voltage of transistor MN2. Transistor MN0 starts turning on as $V_{TRIGGER}$ increases beyond its threshold voltage. This causes the source of transistor MN1 to be pulled towards ground. As the difference between $V_{TRIGGER}$ and the source of transistor MN1 increases above its threshold voltage, transistor MN1 starts to turn on and pull the Schmitt trigger output voltage $V_O$ towards ground. It also causes transistor MN2 to begin turning off. As the input voltage $V_{TRIGGER}$ continues to increase, transistors MN0 and MN1 are turned on even more and pull the Schmitt trigger output voltage $V_O$ to a logic "0" level (i.e., ground). Once $V_{TRIGGER}$ approaches $V_{DD}$ and $V_O$ on conductor 22 moves close to ground, transistor MP2 is turned on, while transistors MP1 and MP0 are turned off. The operation is entirely analogous for the case in which the Schmitt trigger input voltage $V_{TRIGGER}$ decreases from a logic "1" level to a logic "0" level.

The fact that transistors MN2 and MP2 are turned on when $V_{TRIGGER}$ is at a logic "0" level and logic "1" level, respectively, shows how the positive feedback from these transistors sets different "upper" and "lower" switching voltages for Schmitt trigger 20. This results in Schmitt trigger 20 having a suitable amount of hysteresis. In one embodiment of the invention, the minimum "upper" switching voltage is 1.63 volts while the maximum "lower" switching voltage is 1.51 volts. This hysteresis is desirable because it avoids Schmitt trigger 20 being triggered by minor fluctuations in the supply voltage $V_{DD}$. The operation of Schmitt trigger 20 is described in more detail on pages 355-362 in the textbook "CMOS Circuit Design, Layout, and Simulation" by R. J. Baker, H. W. Li, and D. E. Boyce, (New York: Wiley-IEEE Press, 1998).

Figure 4A:
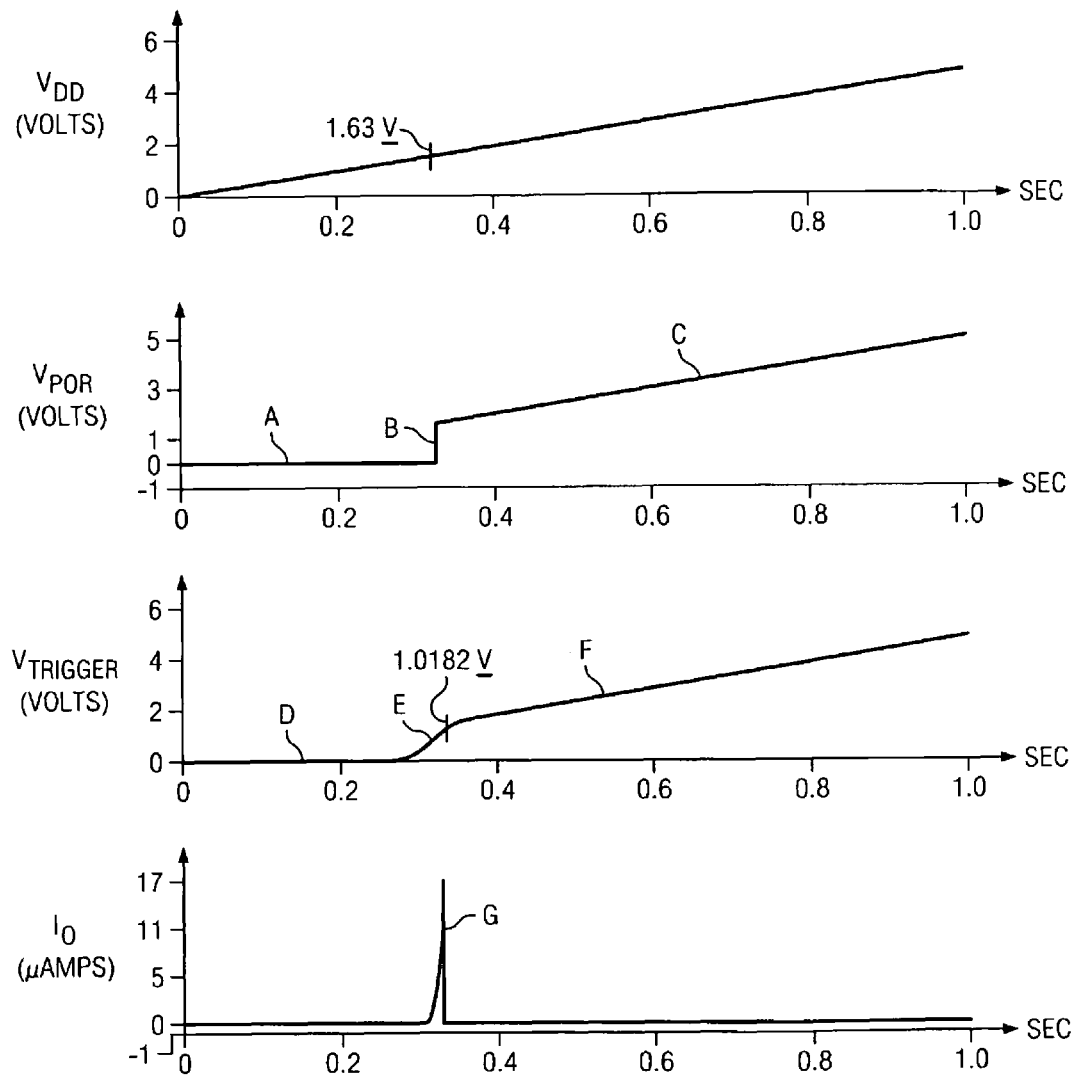
FIGS. 4A-C are timing diagrams for the response of the POR circuit of FIG. 2 to various ramp-up and ramp-down conditions of the supply voltage $V_{DD}$.

Simulated waveforms of POR circuit 10 for a slow ramp-up of $V_{DD}$ over a 1-second interval are shown in FIG. 4A. During segment D of the $V_{TRIGGER}$ waveform, transistor MP is turned off. This causes $V_{TRIGGER}$ to remain close to 0 volts until $V_{DD}$ has increased above the threshold voltage of transistor MP. Once this occurs, transistor MP turns on and starts increasing $V_{TRIGGER}$. As $V_{TRIGGER}$ steadily increases, transistor JP0 begins to pinch-off and act like a voltage-controlled resistor which increases in resistance as $V_{TRIGGER}$ increases. This causes the $V_{TRIGGER}$ waveform to increase steeply, as indicated by segment E in FIG. 4A.

As $V_{TRIGGER}$ increases above the upper switching voltage of Schmitt trigger 20, it causes Schmitt trigger 20 and inverter 23 to switch states and change $V_{POR}$ from a logic low or "0" level to a logic high or "1" level as indicated by segment B in FIG. 4A. The switching of Schmitt trigger 20 and inverter 23 also produces a spike G in the total current $I_0$ of POR circuit 10.

$V_{DD}$ continues to ramp up slowly after Schmitt trigger 20 and inverter 23 have switched states. When $V_{TRIGGER}$ has increased enough that transistor JP0 is completely pinched off, the total current $I_0$ will decrease and remain at a low level as a result of the pinched-off channel resistance of transistor JP0 in series with the high resistance of discharge resistor $R_0$. At this point, $V_{TRIGGER}$ will have become essentially equal to $V_{DD}$ and $V_{DDF}$. Therefore, $V_{TRIGGER}$ follows the upward ramping of $V_{DD}$. During steady state conditions, the total current $I_0$ is determined by the circuit branch of POR circuit 10 which is formed by transistor MP, discharge resistor $R_0$, and the effective impedance of transistor JP0 that acts as a voltage-controlled resistor. As mentioned previously, the effective impedance of transistor JP0 increases as $V_{TRIGGER}$ increases. This helps keep the total current $I_0$ drawn by POR circuit 10 at a minimum. In one embodiment of the invention, the steady-state value of the total current $I_0$ is approximately 65 nanoamperes.

Figure 4B:
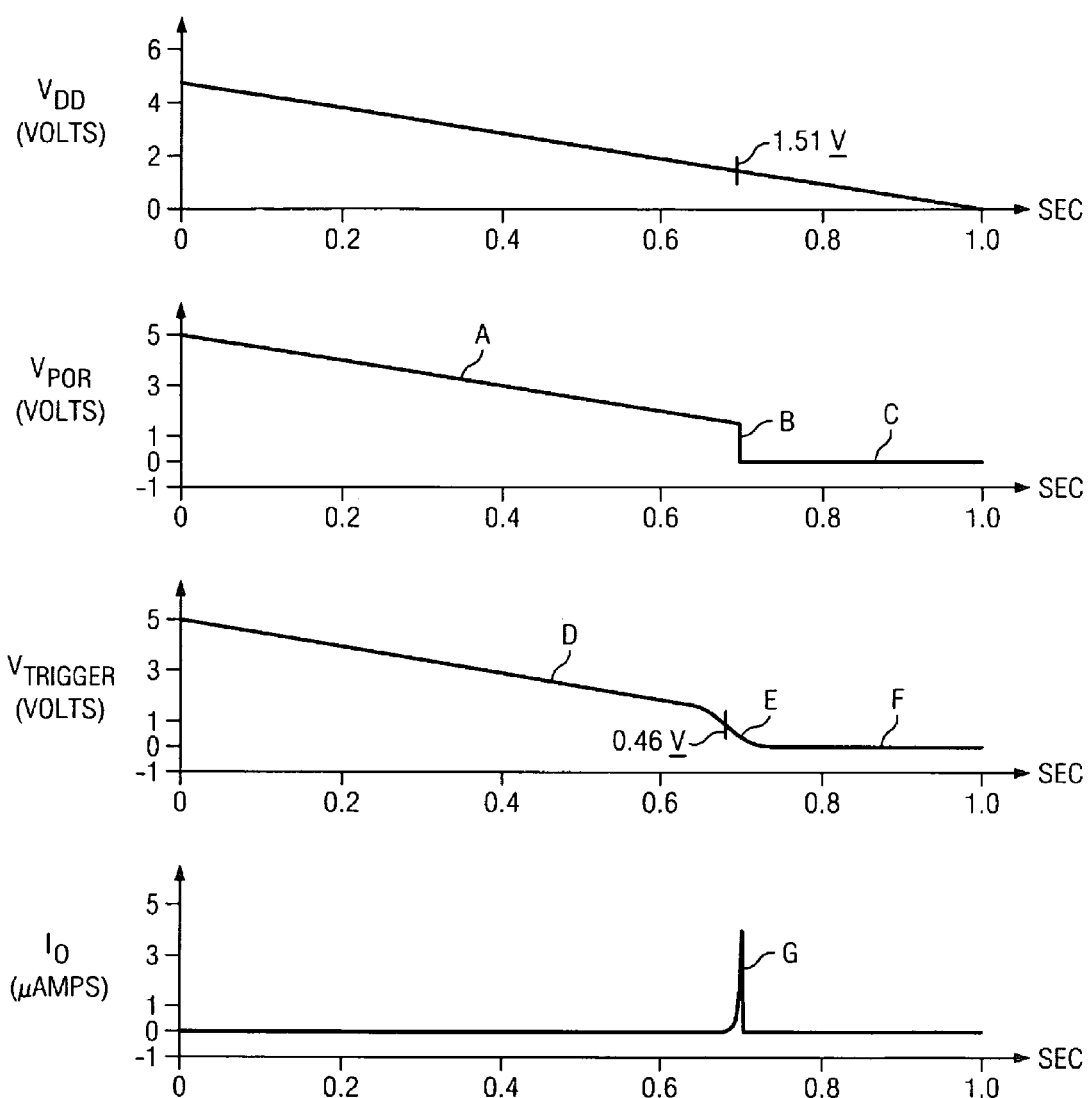

The simulated waveforms of POR circuit 10 for a slow ramp-down of $V_{DD}$ over a 1-second interval are shown in FIG. 4B. Transistor JP0 is initially pinched off during segment D of the $V_{TRIGGER}$ waveform. The effective impedance of transistor JP0 decreases as the value of $V_{TRIGGER}$ on its gate decreases. As displayed in FIG. 4B, $V_{POR}$ and $V_{TRIGGER}$ follow $V_{DD}$ as it decreases during segments A and D. When $V_{TRIGGER}$ reaches the lower switching voltage of Schmitt trigger 20, its output voltage $V_O$ changes from a logic low or "0" level to a logic high or "1" level. This causes the output $V_{POR}$ of inverter 23 to undergo a transition from a logic high or "1" level to a logic low or "0" level as shown in segment B. The switching of Schmitt trigger 20 and inverter 23 causes a spike G in the total current $I_0$ drawn by POR circuit 10. The charge on discharge capacitor $C_0$ is removed through resistor $R_0$ and transistor JP0 (which is no longer pinched off) during segment F of the $V_{TRIGGER}$ waveform.

Figure 4C:
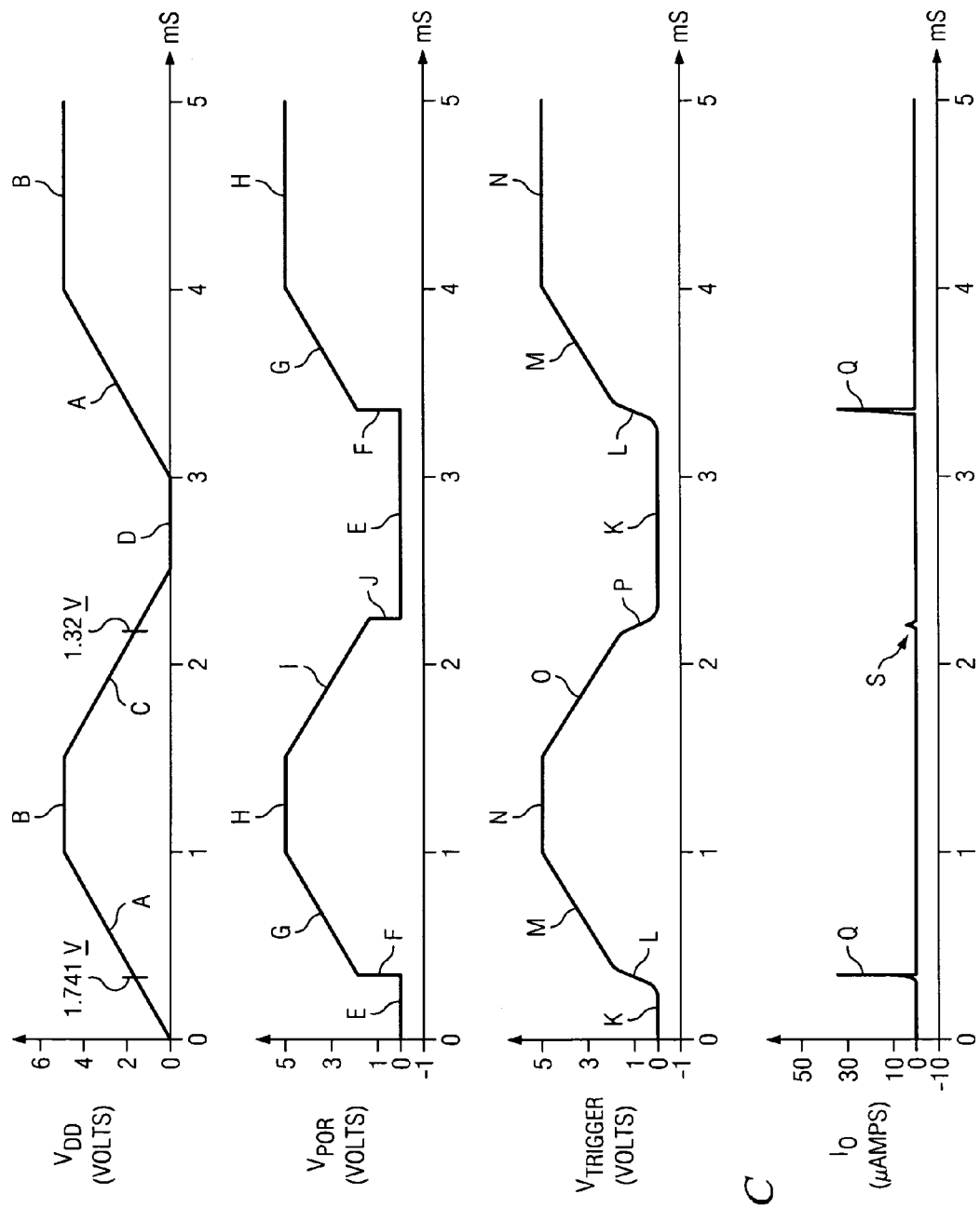

FIG. 4C shows simulated timing waveforms of the transient response of POR circuit 10 to a rapid ramp-up followed by a ramp-down of $V_{DD}$ over a 2.5 millisecond interval. During segment A, $V_{DD}$ increases from 0 to +5 volts. Moreover, transistor JP0 is initially turned on. $V_{TRIGGER}$ remains close to 0 volts as indicated by segment K until $V_{DD}$ exceeds the threshold voltage of transistor MP. As $V_{TRIGGER}$ increases, the channel of transistor JP0 starts to pinch off. This causes its channel resistance to increase, which in turn causes $V_{TRIGGER}$ to increase rapidly as indicated by segment L of the $V_{TRIGGER}$ waveform. Once $V_{TRIGGER}$ rises above the upper switching voltage of Schmitt trigger 20, the output $V_O$ of Schmitt trigger 20 changes from a logic high or "1" level to a logic low or "0" level. Inverter 23 is forced to switch states and change $V_{POR}$ from 0 volts to $V_{DD}$ as indicated by segment F. The switching of Schmitt trigger 20 and inverter 23 generates spike Q in the $I_0$ waveform. As $V_{DD}$ continues to increase after the transition of $V_{POR}$ shown by segment F, $I_0$ remains at a constant low value determined mainly by the resistance of discharge resistor $R_0$ and the channel resistance of transistor JP0. $V_{TRIGGER}$ also closely follows segment A of the $V_{DD}$ waveform during this period as shown in segment M. Since the upper supply voltage terminals of Schmitt trigger 20 and inverter 23 are connected to $V_{DD}$, segment G of the $V_{POR}$ waveform closely follows segment A of the $V_{DD}$ waveform. After $V_{DD}$ levels off at +5 volts (see segment B), $V_{TRIGGER}$ and $V_{POR}$ do the same as indicated by segments N and H, respectively.

When $V_{DD}$ ramps down from +5 volts to 0 volts (refer to segment C), $V_{TRIGGER}$ and $V_{POR}$ closely follow $V_{DD}$ as indicated by segments O and I, respectively. This occurs because transistor JP0 is pinched off and transistor MP is turned on. Once $V_{TRIGGER}$ reaches the lower switching voltage of Schmitt trigger 20, it causes Schmitt trigger 20 and inverter 23 to switch states. This in turn forces $V_{POR}$ to change from the present value of $V_{DD}$ to 0 volts as indicated by segment J. The switching of Schmitt trigger 20 and inverter 23 produces a very small spike S in the $I_0$ waveform. As $V_{DD}$ decreases further, transistor MP is turned off. This causes capacitor $C_0$ to discharge through resistor $R_0$ and transistor JP0. This in turn decreases the value of $V_{TRIGGER}$ as shown in segment P. Once capacitor $C_0$ is discharged, $V_{TRIGGER}$ settles to 0 volts as indicated by segment K.

Figure 1A:
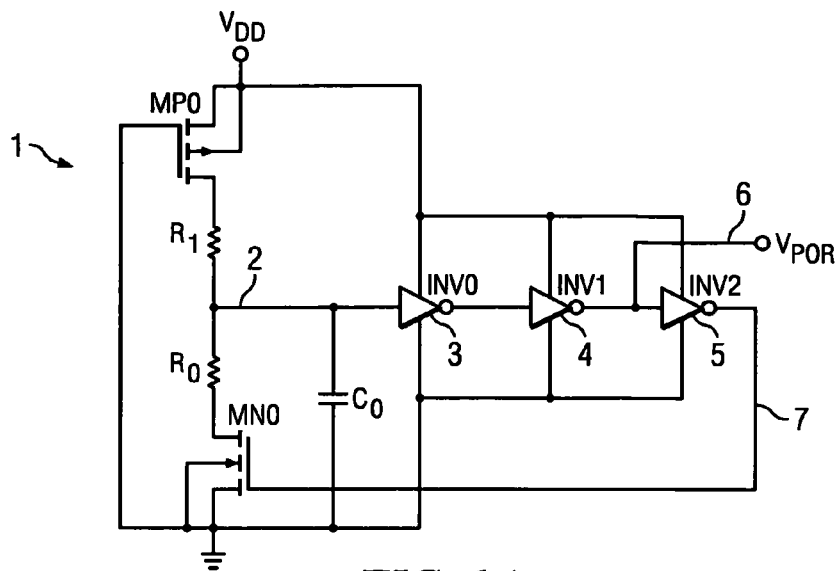
FIG. 1A is a schematic diagram of a prior art POR circuit.
Figure 1B:
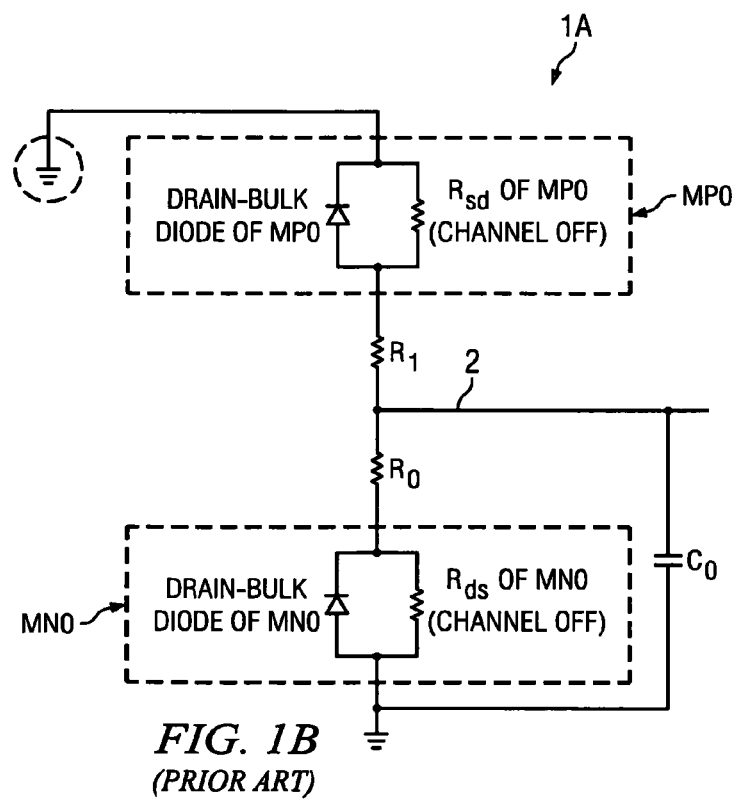
FIG. 1B is an equivalent circuit of the POR circuit of FIG. 1A immediately after an interruption of the supply voltage $V_{DD}$.

It should be noted that if the $V_{DD}$ waveform of FIG. 4C is applied to the prior art POR circuit 1 of FIG. 1A, its power-on reset output signal $V_{POR}$ would immediately begin tracking $V_{DD}$ during the second ramp-up after segment D. Consequently, there would be no appreciable delay between the beginning of segment A of the $V_{DD}$ waveform and segment F of the $V_{POR}$ waveform. This would prevent a normal $V_{POR}$ signal from being generated after any short interruption of the normal $V_{DD}$ supply voltage, which could possibly result in the faulty operation of application circuitry (not shown) receiving the $V_{POR}$ signal.

One embodiment of the described power-on reset circuit in FIG. 2 draws a total current $I_0$ substantially less than 100 nanoamperes for $V_{DD}$ values between +2.7 and +5.5 volts. The total current $I_O$ does not increase linearly with $V_{DD}$ as is the case with typical prior art POR circuits. Furthermore, the circuit occupies a chip area of only 0.0171 mm$^2$.

While the invention has been described with reference to several particular embodiments, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, in some cases, the junction field-effect transistor JP0 of the described embodiments of the invention could be replaced by a depletion mode MOSFET. Using a depletion mode MOSFET might allow the use of different MOSFET threshold voltages. This could be advantageous in some designs.

Although a Schmitt trigger is disclosed in the described embodiments, a standard inverter could be used, although the user would not obtain the benefits of the hysteresis of a Schmitt trigger. Accordingly, the term "trigger circuit" as used herein is intended to encompass either a Schmitt trigger or an inverter.

What is claimed is:

1. A power-on reset (POR) circuit comprising:
   a first transistor having a source coupled to a first supply voltage and a gate coupled to a second supply voltage;
   a second transistor having a drain coupled to the second supply voltage and a gate coupled to a drain of the first transistor, wherein the second transistor is a depletion mode transistor, and wherein a channel of the second transistor is pinched off when the gate of the second transistor is at a voltage close to the first supply voltage;
   a resistor having a first terminal coupled to the source of the second transistor and a second terminal coupled to the drain of the first transistor;
   a discharge capacitor having a terminal coupled to the drain of the first transistor; and
   a trigger circuit having an input coupled to receive from the second terminal of the first resistor and the terminal of the discharge capacitor, for producing an output voltage representative of a power-on reset signal in response to an interruption of the first supply voltage.

2. The power-on reset circuit of claim 1, the trigger circuit further comprises Schmitt trigger circuit.

3. The power-on reset circuit of claim 2, wherein the Schmitt trigger circuit is an inverting Schmitt trigger circuit, and wherein the power-on reset circuit includes an inverter having an input coupled to an output of the Schmitt trigger circuit and an output on which the power-on reset signal is produced.

4. The power-on reset circuit of claim 2, wherein the Schmitt trigger circuit has a first switching voltage at which the Schmitt trigger circuit switches from a first state to a second state when the first signal increases from a voltage less than the first switching voltage to a voltage greater than the first switching voltage, and wherein the Schmitt trigger circuit includes a second switching voltage at which the Schmitt trigger circuit switches from the second state to the first state when the first signal decreases from a voltage greater than the second switching voltage to a voltage less than the second switching voltage.

5. The power-on reset circuit of claim 4, wherein a difference between the first switching voltage and the second switching voltage is at least approximately one-tenth of a volt.

6. The power-on reset circuit of claim 5, wherein the Schmitt trigger circuit includes first, second, third, fourth, fifth and sixth transistors, the first transistor having a source coupled to the first supply voltage and a drain coupled to a source of the second transistor and a source of the third transistor, the fourth transistor having a source coupled to a second supply voltage and a drain coupled to a source of the fifth transistor and a source of the sixth transistor, drains of the second and fifth transistors being coupled to an output conductor of the Schmitt trigger circuit to produce the output voltage on the output conductor, gates of the third and sixth transistors being connected to the output conductor, a drain of the third transistor being coupled to the second supply voltage and the drain of the sixth transistor being coupled to the first supply voltage.

7. The power-on reset circuit of claim 6, wherein the first, second, and third transistors of the Schmitt trigger circuit are P-channel transistors and the fourth, fifth, and sixth transistors of the Schmitt trigger circuit are N-channel transistors.

8. The power-on reset circuit of claim 7, wherein the first, second, third, fourth, fifth, and sixth transistors of the Schmitt trigger circuit have channel resistances which cause the first switching voltage to be at least approximately one-tenth of a volt greater than the second switching voltage.

9. The power-on reset circuit of claim 2, wherein the drain of the first transistor is coupled to the first terminal of the resistor by means of a third transistor having a gate connected to the gate of the first transistor.

10. The power-on reset circuit of claim 1, wherein the first transistor is a P-channel transistor and the second transistor is a P-channel transistor.

11. The power-on reset circuit of claim 10, wherein the first transistor is a metal oxide semiconductor (MOS) field-effect transistor and the second transistor is a junction field-effect transistor.

12. The power-on reset circuit of claim 1, wherein the resistor has a resistance greater than approximately 1 megohm.

13. The power-on reset circuit of claim 12, wherein the resistor is composed of polycrystalline silicon.

14. The power-on reset circuit of claim 1, wherein the source of the first transistor is coupled to the first supply voltage by means of a filter circuit.

15. A method for producing a POR signal in response to an interruption of a first supply voltage, the method comprising:
   coupling the first supply voltage, by means of a first transistor, to a first conductor that is coupled to a first terminal of a discharge resistor, a terminal of a discharge capacitor, and an input of a trigger circuit, a first signal being produced on the first conductor an the gate of the first transistor to the second supply voltage;
   coupling a second transistor between the second supply voltage and a second terminal of the discharge resistor, wherein the second transistor is a depletion mode transistor, and turning on the second transistor;
   charging the discharge capacitor through the first transistor to produce the first signal by increasing the first supply voltage after the interruption so as to cause the trigger circuit to produce an output signal representative of the power-on reset signal;
   discharging the discharge capacitor through the discharge resistor, a resistance of the discharge resistor being sufficiently high to provide a predetermined low average power dissipation of the power-on reset circuit; and
   coupling a gate of the second transistor to a drain of the first transistor and discharging the discharge capacitor through both the discharge resistor and the second transistor, wherein the resistance of the discharge resistor and an effective impedance of the second transistor are sufficiently high to provide the predetermined low average power dissipation of the power-on reset circuit.

16. The method of claim 15 wherein, the trigger circuit further comprises a Schmitt trigger circuit.

17. The method of claim 16, wherein the method further comprises providing the first transistor as a MOS P-channel field-effect transistor and the second transistor as a P-channel junction field-effect transistor.

18. The method of claim 16, wherein the method further comprises causing the Schmitt trigger circuit to have a first switching voltage at which the Schmitt trigger circuit switches from a first state to a second state when the first signal increases from a voltage less than the first switching voltage to a voltage greater than the first switching voltage, and causing the Schmitt trigger circuit to have a second switching voltage at which the Schmitt trigger circuit switches from the second state to the first state when the first signal decreases from a voltage greater than the second switching voltage to a voltage less than the second switching voltage.

19. The method of claim 16, wherein the Schmitt trigger circuit is an inverting Schmitt trigger circuit, the method including coupling the output signal of the Schmitt trigger circuit to an input of an inverter to generate the power-on reset signal on an output of the inverter.

* * * * *